(12) United States Patent
Yang

(10) Patent No.: US 9,787,265 B2
(45) Date of Patent: Oct. 10, 2017

(54) OFFSET CORRECTION APPARATUS FOR DIFFERENTIAL AMPLIFIER AND METHOD THEREOF

(71) Applicant: Hyundai Motor Company, Seoul (KR)

(72) Inventor: Sang-Hyeok Yang, Gyeonggi-do (KR)

(73) Assignee: Hyundai Motor Company, Seoul (KR)

(*) Notice: Subject to any disclaimer, the term of this patent is extended or adjusted under 35 U.S.C. 154(b) by 56 days.

(21) Appl. No.: 14/444,651

(22) Filed: Jul. 28, 2014

(65) Prior Publication Data
US 2015/0171805 A1   Jun. 18, 2015

(30) Foreign Application Priority Data
Dec. 16, 2013 (KR) .................. 10-2013-0156689

(51) Int. Cl.
*H03F 1/02* (2006.01)
*H03F 3/45* (2006.01)

(52) U.S. Cl.
CPC ..... *H03F 3/45977* (2013.01); *H03F 3/45475* (2013.01); *H03F 2200/78* (2013.01);
(Continued)

(58) Field of Classification Search
CPC .... H03F 3/34; H03F 1/02; H03F 1/08; H03K 5/08; H03K 5/00; H03M 1/66; H03M 1/00; H03M 3/00
USPC ........ 330/9, 51, 69, 107, 109, 257; 327/124, 327/307, 337, 341, 551, 561; 333/173; 341/61, 77, 114, 118, 132, 134, 135, 136, 341/139, 142, 143, 144, 150, 155, 156, 341/172, 186
See application file for complete search history.

(56) References Cited

U.S. PATENT DOCUMENTS 4,987,327 A   1/1991 Fernandez et al.
6,225,863 B1* 5/2001 Miwa .................. H03F 3/45183
                                                    327/307
(Continued)

FOREIGN PATENT DOCUMENTS

KP   10-2002-0085867 A   11/2002
KR   10-2004-0071977 A    8/2004
(Continued)

*Primary Examiner* — Steven J Mottola
*Assistant Examiner* — Hafizur Rahman
(74) *Attorney, Agent, or Firm* — Mintz Levin Cohn Ferris Glovsky and Popeo, P.C.; Peter F. Corless

(57) ABSTRACT

An apparatus of correcting an offset for a differential amplifier which compensates a direct current (DC) offset voltage in a differential analog signal amplifier using a resistive feedback structure to minimize a deviation and a method thereof are provided. The apparatus includes a differential amplifier that is configured to amplify a common DC voltage input via a first resistor and a second resistor with a predetermined amplification factor to output the amplified voltage. A controller is configured to compare voltages output from both output terminals of the differential amplifier to determine whether to generate an offset. In addition, the offset is corrected using a switching unit coupled in parallel to an input terminal of the differential amplifier in response to detecting a generated offset. The controller is also configured to adjust an asymmetric property of the input terminal of the differential amplifier to correct the generated offset.

4 Claims, 3 Drawing Sheets

(52) U.S. Cl.
 CPC .............. *H03F 2203/45008* (2013.01); *H03F 2203/45528* (2013.01); *H03F 2203/45594* (2013.01)

(56) References Cited

U.S. PATENT DOCUMENTS

| | | | | |
|---|---|---|---|---|
| 6,388,521 | B1 * | 5/2002 | Henry | H03F 3/45766 |
| | | | | 327/307 |
| 7,592,848 | B2 * | 9/2009 | Hayakawa | H03F 3/45475 |
| | | | | 327/307 |
| 7,755,421 | B2 * | 7/2010 | Chen | H03F 3/45973 |
| | | | | 330/9 |
| 7,812,665 | B2 * | 10/2010 | Eschauzier | H03F 3/45753 |
| | | | | 327/124 |
| 8,253,470 | B2 * | 8/2012 | Mulder | H03F 3/45192 |
| | | | | 327/306 |
| 8,854,126 | B2 * | 10/2014 | Ishigami | H03F 1/0261 |
| | | | | 330/69 |
| 2012/0206197 | A1 * | 8/2012 | Yamazaki | H03F 3/45475 |
| | | | | 330/69 |

FOREIGN PATENT DOCUMENTS

| | | |
|---|---|---|
| KR | 10-2005-0008524 A | 1/2005 |
| KR | 10-2012-0094423 A | 8/2012 |

\* cited by examiner

OFFSET CORRECTION APPARATUS FOR DIFFERENTIAL AMPLIFIER AND METHOD THEREOF

CROSS-REFERENCE TO RELATED APPLICATION

This application claims priority to and the benefit of Korean Patent Application No. 10-2013-0156689 filed in the Korean Intellectual Property Office on Dec. 16, 2013, the entire contents of which are incorporated herein by reference.

BACKGROUND (a) Field of the Invention

The present invention relates to a differential amplifier, and more particularly, to an offset correction apparatus for a differential amplifier that compensates a direct current (DC) offset voltage in a differential analog signal amplifier using a resistive feedback structure to minimize a deviation and a method thereof.

(b) Description of the Related Art

FIG. 3 is an exemplary schematic diagram illustrating a general fully-differential amplifier. Referring to FIG. 3, the fully-differential amplifier 10 having a resistive feedback structure is configured to amplify a signal by an amplification factor set by receiving two signals A having a phase of 180 degrees as inputs. In particular, only when DC components of the two input signals match exactly, is a signal amplified by an amplification factor which is determined in the form of "B" output.

However, when the DC components of the two input signals do not exactly match, a difference between the DC components is increased by the amplification factor to cause a signal in the form of "C" to appear at an output terminal. Further, even though the DC components of the input signals match, DC offset may occur due to asymmetrical components of the amplifier 10. When a predetermined size or greater of DC offset occurs in a circuit having a substantially large amplification factor, differences in DC voltages of the output signals are significant and, the circuit may be saturated beyond the maximum or minimum voltage.

The above information disclosed in this section is merely for enhancement of understanding of the background of the invention and therefore it may contain information that does not form the prior art that is already known in this country to a person of ordinary skill in the art.

SUMMARY

The present invention provides an apparatus of correcting an offset for a differential amplifier that compensates a DC offset voltage in a differential amplifier using a resistive feedback structure to minimize a deviation and a method thereof.

An exemplary embodiment of the present invention provides an offset correcting apparatus for a differential amplifier that may include a differential amplifier configured to amplify a common DC voltage input via a first resistor and a second resistor with a predetermined amplification factor and output the amplified voltage; a comparator configured to determine whether to generate an offset by comparing voltages output from both output terminals of the differential amplifier; a controller configured to adjust the offset using a switching unit when the comparator detects a generated offset; and a switching unit coupled in parallel to an input terminal of the differential amplifier and configured to adjust the generated offset by adjusting an asymmetric property of the input terminal of the differential amplifier according to the controller.

The comparator may be configured to output information regarding a voltage size by determining the voltage size of the input terminal when an offset is generated from an output of the differential amplifier. The comparator may also be configured to perform a comparison operation by a clock applied from the controller and maintain an off status to reduce power consumption when no clock is applied. The offset correcting apparatus may further include a counter configured to provide a feedback signal for adjusting the offset in accordance with the output of the comparator to the controller. The switching unit may include an array of semiconductor switching devices and may be configured to adjust the offset by adjusting an amplitude and a length of the input voltage in accordance with a switching arrangement.

Another exemplary embodiment of the present invention provides an offset correcting method of a differential amplifier that may include: performing an initializing process by disconnecting an input terminal of a differential amplifier when entering an offset correcting mode of the differential amplifier; determining whether to generate an offset by supplying a common voltage to both input terminals of the differential amplifier and comparing outputs voltages of both output terminals of the differential amplifier amplified with a predetermined amplification factor; and adjusting the offset by adjusting an array arrangement of a semiconductor switching device coupled in parallel to the input terminal of the differential amplifier and an asymmetric property of the voltage of the input terminal in response to determining that the offset of the differential amplifier is generated.

The method may further include adjusting an asymmetric property of a positive input terminal or a negative input terminal by adjusting the array arrangement of the semiconductor switching device according to the generated offset of the differential amplifier. As described above, according to the exemplary embodiments of the present invention, no analog-to-digital conversion (ADC) and digital-to-analog conversion (DAC) are used for the differential amplifier to adjust a DC offset thus simplifying a circuit configuration and a DC offset correcting circuit may be implemented by a digital circuit to minimize the power consumption. Further, according to the exemplary embodiments of the present invention, metal-oxide-semiconductor field-effect transistor (MOSFET) array connection may be used to adjust the DC offset to prevent the resistance feedback from affecting the entire amplification factor. Therefore, the DC offset may be more stably and reliably corrected.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
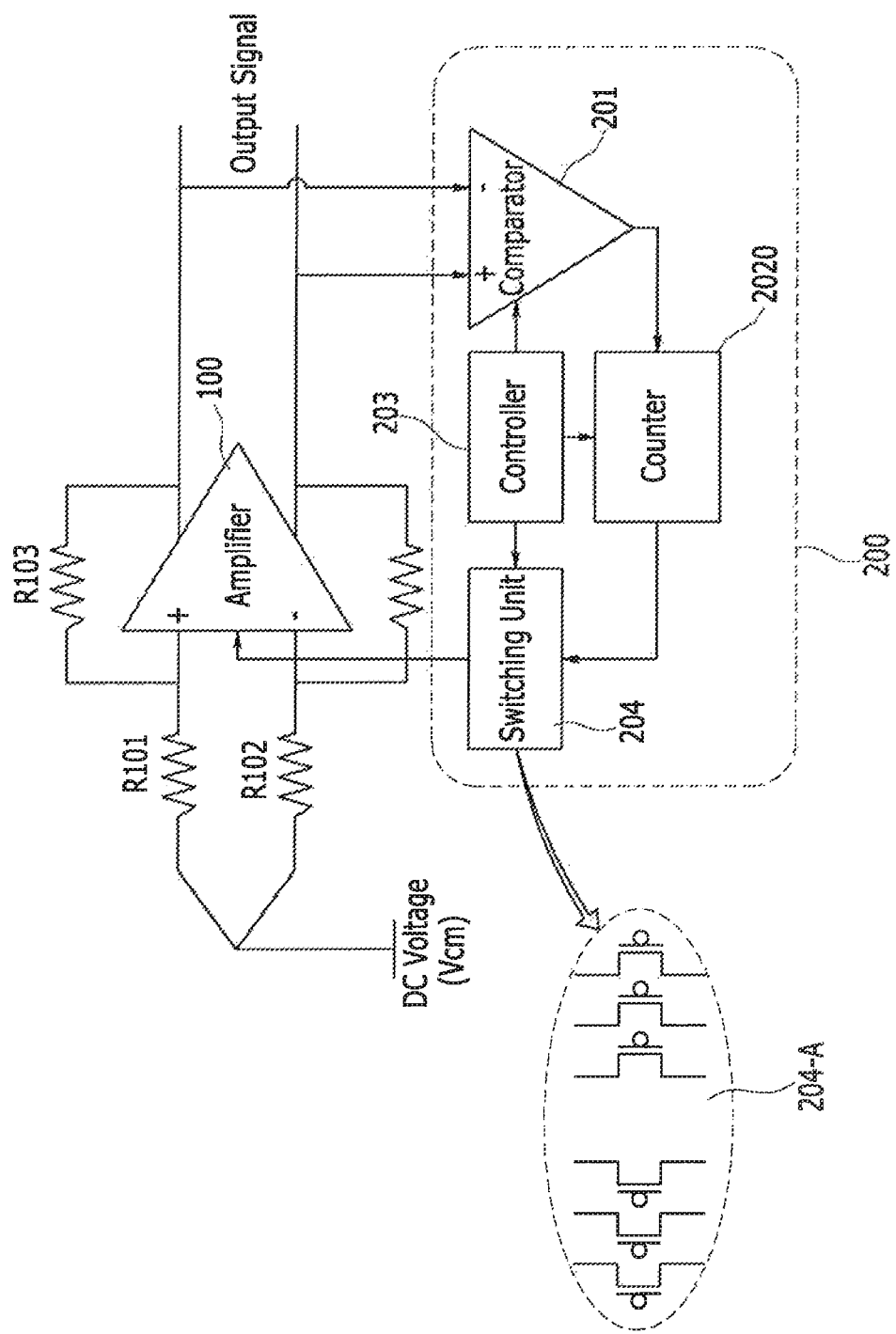
FIG. 1 is an exemplary schematic diagram illustrating an offset correcting apparatus of a differential amplifier according to an exemplary embodiment of the present invention.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below. Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, exemplary embodiments of the present invention have been shown and described, simply by way of illustration. As those skilled in the art would realize, the described exemplary embodiments may be modified in various different ways, all without departing from the spirit or scope of the present invention. Accordingly, the drawings and description are to be regarded as illustrative in nature and not restrictive. Like reference numerals designate like elements throughout the specification. In addition, each configuration shown in the drawings is arbitrarily shown for understanding and ease of description, but the present invention is not limited thereto.

FIG. 1 is an exemplary schematic diagram illustrating an offset correcting apparatus for a differential amplifier according to an exemplary embodiment of the present invention. Referring to FIG. 1, an offset correcting apparatus for a differential amplifier according to an exemplary embodiment of the present invention may include a differential amplifier 100, a comparator 201, a counter 202, a controller 203, and a switching unit 204. The controller 203 may be configured to operate the comparator 201, the counter 202, and the switching unit 204.

The differential amplifier 100 may be configured to amplify a common DC voltage input via a first resistor R101 and a second resistor R102 with a predetermined amplification factor and output the amplified DC voltage. The comparator 201 may be configured to connect both output terminals of the differential amplifier 100 and determine whether to generate an offset by comparing two voltages output from both output terminals of the differential amplifier 100. In addition, the comparator 201 may be configured to output an information regarding which input is greater when the offset is generated. In response to detecting that the offset is generated from the output of the differential amplifier 100, when a positive input is greater than a negative input, the output may be a VDD voltage to cause the comparator 201 to output a signal of "1" and when a negative input is greater than a positive input, the comparator 201 may be configured to output a signal of "0" and provide the signal to the counter 202. In other words, the comparator 201 may be configured to compare both outputs of the differential amplifier 100 and when an offset is generated, the comparator 201 may be configured to determine which voltage is a greater input.

The comparator 201 may be controlled by a clock applied from the controller 203 and may be configured to perform a comparing operation by the clock applied from the controller 203. When the clock is not applied (e.g., is not initialized by the controller 203) from the controller 203, an off status may be maintained to reduce power consumption. The counter 202 may be configured by a binary counter and may be configured to count the output of the comparator 201 to provide the output as a feedback signal to adjust (e.g., correct) the offset.

furthermore, a circuit area and a countable number of the counter 202 may be determined in accordance with an output bit number and the counter 202 may have a memory to store the various outputs and inputs. The controller 203 may be configured to operate the comparator 201, the counter 202, and the switching unit 204 in accordance with time. The controller 203 may be configured to adjust the offset by operating the switching unit 204 in accordance with the output offset of the differential amplifier 100 determined in the comparator 201. Accordingly, the controller 203 may be implemented by at least one processor which operates by a predetermined program and the predetermined program may be programmed to perform individual steps of an offset correcting method of a differential amplifier according to an exemplary embodiment of the present invention.

The switching unit 204 may be coupled in parallel to the input terminal of the differential amplifier 100 and may be configured to adjust the offset by adjusting an asymmetrical property of the input terminal in response to the control of the controller 203. The switching unit 204 may be connected to the input terminal of the differential amplifier 100 and may be configured by a semiconductor switching device, for example, an MOSFET array to output a signal having about same width and length. When an offset is generated from the output of the differential amplifier 100, the MOSFET array may be switched in response to the operation of the controller 203 to cause the switching unit 204 to adjust the offset by adjusting an amplitude and a length of the asymmetric property for the input terminal of the differential amplifier 100. The MOSFET array which configures the switching unit 204 may be sequentially increased in accordance with the feedback information provided in the counter 202. Thus, the switching unit 204 may be configured to minutely (e.g., minimally) adjust an amplitude and a length of the asymmetric property.

Figure 2:
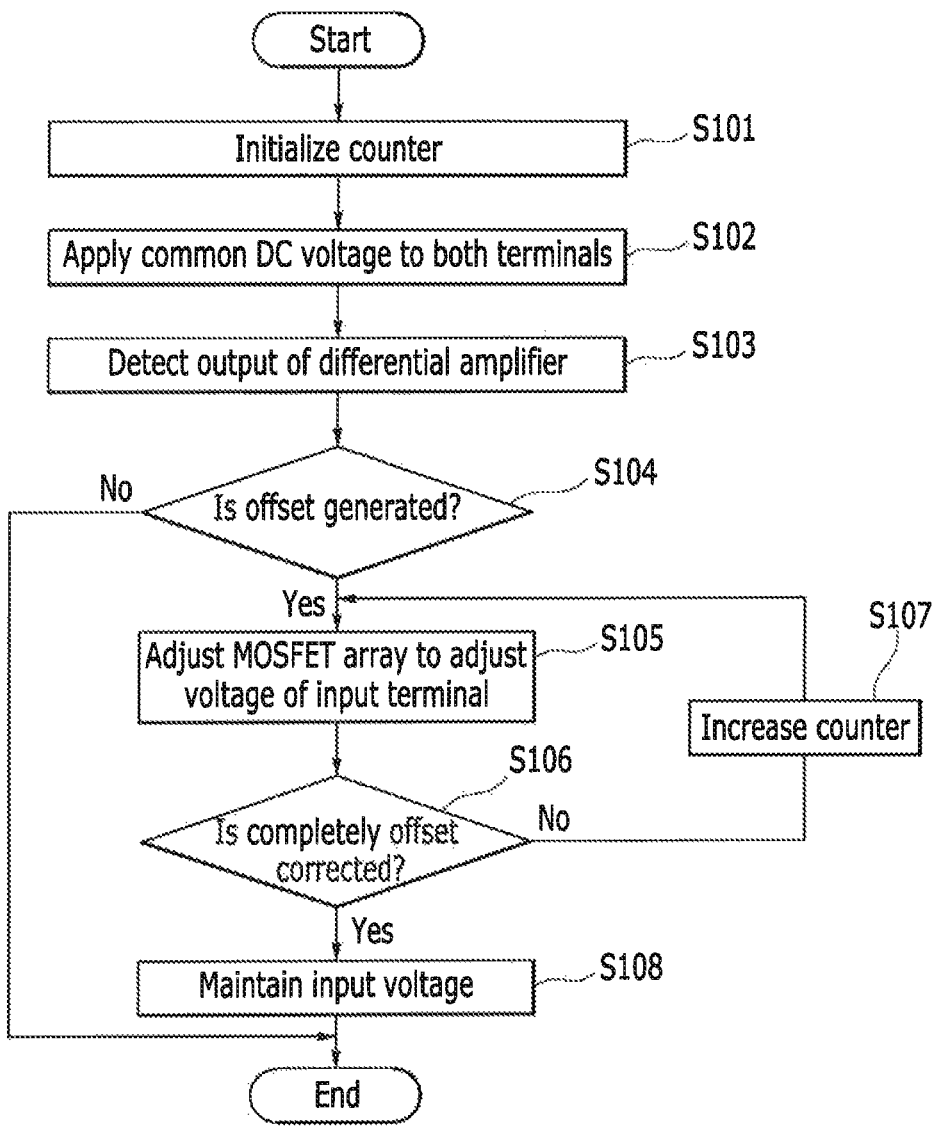
FIG. 2 is an exemplary flowchart of a method of correcting an offset of a differential amplifier according to an exemplary embodiment of the present invention.
Figure 3:
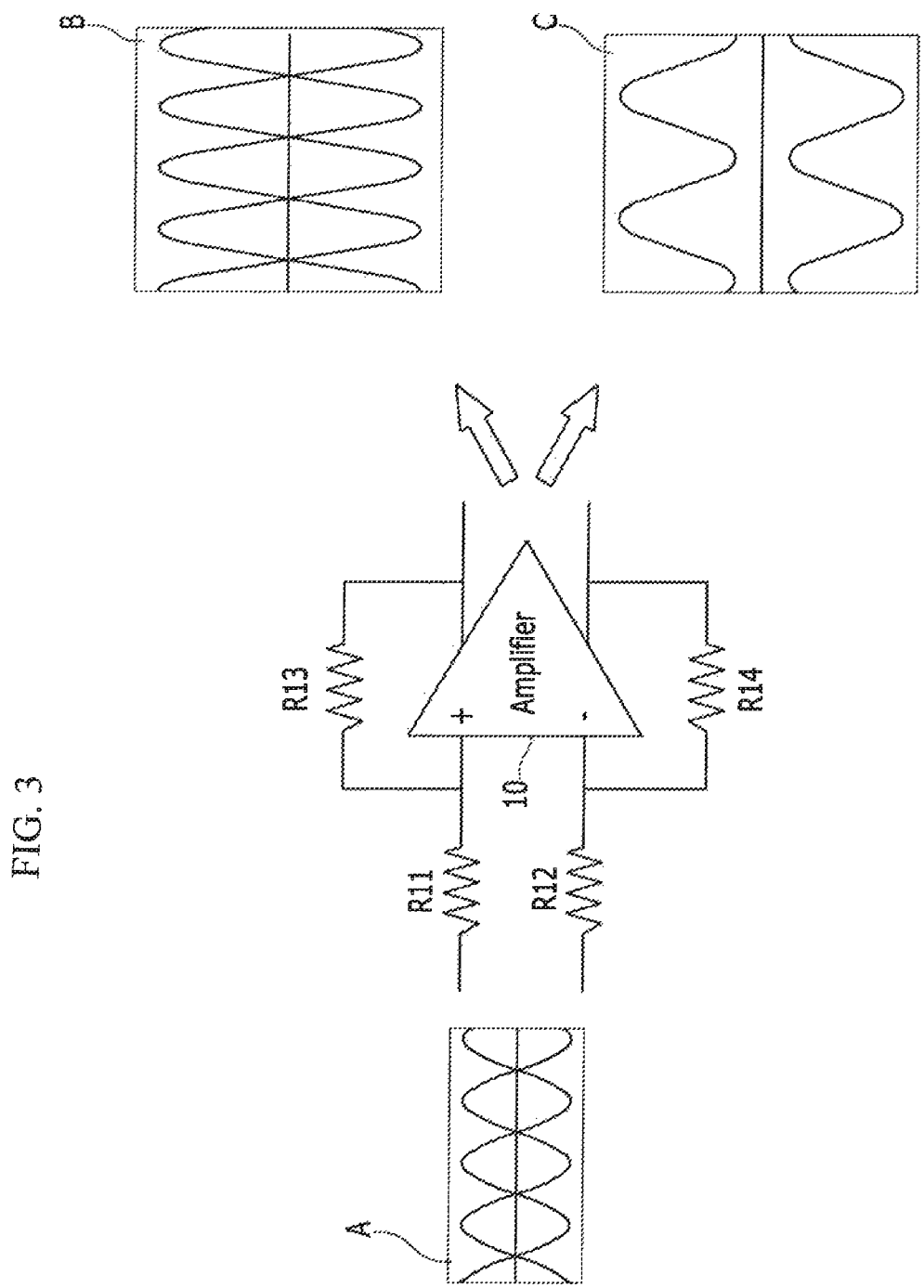
FIG. 3 is an exemplary schematic diagram illustrating a general fully-differential amplifier according to the related art.

Hereinafter, an offset correcting method of a differential amplifier according to an exemplary embodiment of the present invention will be described in detail with reference to FIG. 2. FIG. 2 is an exemplary flowchart of a method of correcting an offset for a differential amplifier according to an exemplary embodiment of the present invention.

First, when a differential amplifier 100 according to an exemplary embodiment of the present invention enters an offset correcting mode, the controller 203 may be configured to perform an initializing process by disconnecting both input terminals of the differential amplifier 100 in step S101. Next, when the initializing process is completed, the controller 203 may be configured to apply a common DC voltage to both input terminals of the differential amplifier 100 in step S102. The common DC voltage applied to both input terminals of the differential amplifier 100 may be determined as a voltage which may be about half the entire voltage range to determine the maximum offset.

In step S102, when the common DC voltage is applied to the both input terminals of the differential amplifier 100, the differential amplifier 100 may be configured to output the amplified voltage by amplifying the input voltage with a predetermined amplification factor. In particular, the comparator 201 may be configured to compare the signals output from the both output terminals of the differential amplifier 100 and transmit the result to the controller 203 in step S103. Further, the controller 203 may be configured to determine whether to generate an offset from the output of the differential amplifier 100 by analyzing the signal applied from the comparator 201 in step S104.

When the offset is generated from the output of the differential amplifier 100, the controller 203 may be configured to determine which signal from the output terminals has a greater value than the other, and adjust a voltage of an input terminal of the differential amplifier 100 by switching an MOSFET array which configures a switching unit 204 in step S105. When a signal from a negative output terminal of the differential amplifier 100 has a greater value than a signal from a positive output terminal, the controller 203 may be configured to adjust a voltage input to a positive terminal of the differential amplifier 100 by adjusting the MOSFET array which configures the switching unit 204 to correct the offset caused by a deviation of an amplitude and a length of the input signal. When a signal from the positive output terminal of the differential amplifier 100 has a greater value than a signal from the negative output terminal, the controller 203 may be configured to adjust a voltage input to the negative terminal of the differential amplifier 100 by adjusting the MOSFET array which configures the switching unit 204 to correct the offset caused by the deviation of the amplitude and the length of the input signal.

The controller 203 may be configured to determine whether to completely correct the offset generated due to the deviation of the amplitude and the length of the input signal by adjusting the voltage input to the input terminal of the differential amplifier 100 and the MOSFET array which configures the switching unit 204 in step S106. When the offset for the output voltage of the differential amplifier 100 is not completely corrected, the controller 203 may be configured to increase a counter and then repeatedly perform correction to adjust the MOSFET array which configures the switching unit 204 in step S107. When the offset of the output voltage is corrected by adjusting the MOSFET array which configures the switching unit 204, the controller 203 may be configured to maintain a current condition of the input terminal to prevent the offset from being generated in step S108.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

DESCRIPTION OF SYMBOLS

100: Differential Amplifier
201: Comparator
202: Counter
203: Controller
204: Switching Unit

What is claimed is:

1. An offset correcting apparatus for a differential amplifier, comprising:
   a differential amplifier configured to amplify a common direct current (DC) voltage input via a first resistor and a second resistor with a predetermined amplification factor and output the amplified voltage; and
   a controller having a processor and a memory and configured to:
      determine whether to generate an offset by comparing voltages output from both output terminals of the differential amplifier;
      correct the offset using a switching unit coupled in parallel to an input terminal of the differential amplifier in response to detecting a generated offset; and
      correct the generated offset by adjusting an asymmetric property of the input terminal of the differential amplifier,
   wherein the switching unit includes an array of semiconductor switching devices and the controller is configured to adjust the asymmetric property of the input terminal including the offset of the differential amplifier by adjusting an array arrangement including physical sizes of the semiconductor switching devices to correct the offset, and
   wherein no current sources are used to correct the offset correcting apparatus.

2. The offset correcting apparatus of claim 1, wherein the controller is configured to output information regarding a voltage size by determining the voltage size of the input terminal when an offset is generated from an output of the differential amplifier.

3. The offset correcting apparatus of claim 1, wherein the controller is configured to perform a comparison operation by a clock and maintain an off status to reduce power consumption when the clock remains uninitialized.

4. The offset correcting apparatus of claim 2, further comprising:
   a counter configured to provide a feedback signal for correcting the offset in accordance with the output voltage size information.

* * * * *